(12) United States Patent
Priel et al.

(10) Patent No.: US 9,472,246 B2
(45) Date of Patent: Oct. 18, 2016

(54) METHOD AND APPARATUS FOR MAINTAINING AN ACCURATE I/O CALIBRATION CELL

(71) Applicants: Michael Priel, Netanya (IL); Dan Kuzmin, Givat Shmuel (IL); Sergey Sofer, Rishon Lezion (IL)

(72) Inventors: Michael Priel, Netanya (IL); Dan Kuzmin, Givat Shmuel (IL); Sergey Sofer, Rishon Lezion (IL)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/440,205

(22) PCT Filed: Nov. 7, 2012

(86) PCT No.: PCT/IB2012/056212
§ 371 (c)(1),
(2) Date: May 1, 2015

(87) PCT Pub. No.: WO2014/072769
PCT Pub. Date: May 15, 2014

(65) Prior Publication Data
US 2015/0248924 A1   Sep. 3, 2015

(51) Int. Cl.
*G11C 7/10* (2006.01)
*G11C 29/02* (2006.01)
*G11C 16/34* (2006.01)

(52) U.S. Cl.
CPC ............. *G11C 7/10* (2013.01); *G11C 7/1057* (2013.01); *G11C 7/1066* (2013.01); *G11C 7/1084* (2013.01); *G11C 7/1093* (2013.01); *G11C 29/022* (2013.01); *G11C 16/349* (2013.01); *G11C 2207/2254* (2013.01)

(58) Field of Classification Search
CPC ..... G11C 7/10; G11C 7/1057; G11C 7/1066; G11C 7/1084; G11C 7/1093
See application file for complete search history.

(56) References Cited

U.S. PATENT DOCUMENTS

| | | | |
|---|---|---|---|
| 6,330,194 B1 * | 12/2001 | Thomann | G11C 7/1045 365/189.05 |
| 6,566,911 B1 | 5/2003 | Moyer | |
| 6,791,880 B1 | 9/2004 | Kurihara et al. | |
| 6,807,650 B2 | 10/2004 | Lamb et al. | |

(Continued)

FOREIGN PATENT DOCUMENTS

WO   2005060193 A2   6/2005

OTHER PUBLICATIONS

International Search Report and Written Opinion correlating to PCT/IB2012/056212 dated May 5, 2013.

*Primary Examiner* — Jeffrey Zweizig

(57) ABSTRACT

An integrated circuit includes an input/output "I/O" cell arranged to drive an output signal and an activity analysis unit arranged to generate an activity factor based on the output signal. The activity factor represents a switching activity intensity of the I/O cell. The switching activity intensity is associated with an ageing effect of the I/O cell. The circuit further includes a calibration unit arranged to generate a switching pattern signal based on the generated activity factor and an I/O calibration cell arranged to be driven by the switching pattern signal, wherein the switching pattern signal emulates the ageing effect of the I/O cell.

17 Claims, 5 Drawing Sheets

(56) References Cited

U.S. PATENT DOCUMENTS

| | | | |
|---|---|---|---|
| 7,215,128 B2 * | 5/2007 | Fujisawa | G11C 29/02 324/601 |
| 7,283,070 B1 | 10/2007 | Roy et al. | |
| 7,528,626 B2 | 5/2009 | Kim | |
| 7,928,757 B2 | 4/2011 | Nguyen et al. | |
| 7,940,078 B2 | 5/2011 | Pan | |
| 7,944,761 B2 | 5/2011 | Choi et al. | |
| 7,969,181 B1 | 6/2011 | Fefer et al. | |
| 8,847,604 B2 | 9/2014 | Baumann et al. | |
| 2005/0162948 A1 | 7/2005 | Swanson et al. | |

* cited by examiner

METHOD AND APPARATUS FOR MAINTAINING AN ACCURATE I/O CALIBRATION CELL

FIELD OF THE INVENTION

This invention relates to circuits and methods for maintaining an accurate I/O calibration cell.

BACKGROUND OF THE INVENTION

Modern integrated circuits commonly come in the form of chips. The integrated circuits within a chip communicate with the world outside the chip through metalization layers on the outside of the chip known as signal pads. For communication from within the chip to the world outside, "I/O driver circuits" drive signals or data through the signal pads on the exterior of the chip. The signal pads of various chips are connected together by signal lines thereby allowing communications between different chips.

The electrical connection from the signal pad through the packaging of the chip and the load (on-board transmission line and the load itself) contains parasitic resistance, inductance, and capacitance which interferes with the transmission of the signal from the signal pad. The printed circuit board signal trace itself also contains transmission line characteristic impedance which also interfere with the quality of the transmitters of the signal from the signal pad.

To transmit a signal from one chip to another, it is necessary that the chip transmitting the signal have an appropriate signal driving capability, which drives an appropriate signal waveform for representing information contained in the signal. In general, a large driving capability means a small corresponding driving impedance, and vice versa. For best data transfer performance, the impedance of the I/O driver and the combined impedances of the on-board transmission line and the load should match.

Since the driving impedance is a crucial reference and parameter for driving output signals, a tolerable range allowed in the driving impedance is established in certain signal exchange interface standards. For example, in the Double-Data-Rate (DDR) interface standards, an impedance tolerable range for driving impedance is specified to maintain accuracy in signal exchange. Coupled with ever-increasing frequency expectations and power limitations, the tolerable driving range shrinks.

SUMMARY OF THE INVENTION

The present invention provides an integrated circuit and method for maintaining an accurate I/O calibration cell as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

The term "I/O cell" encompasses an output-only cell or an input and output cell. "I/O pad" and "pad" encompass a metal pad that conveys only an input signal, only an output signal, or both an input signal and an output signal. "I/O pad" include one or more bond pads and/or one or more probe pads. Bond pads may also include wire bond pads, bump bond pads, or any other type of bond pad. "Aging effects" include, but are not limited to, hot carrier injection (HCI), negative or positive bias temperature instability (NBTI/PBTI), electromigration (EM), and/or the resultant impedance change caused from said effect introduced by stresses applied to the integrated circuit, including intensive switching, high temperatures, and/or high voltages. "Switching activity" refers to logic transitions that occur within an I/O cell. "Switching activity intensity" refers to a number of transitions that occur within a single I/O cells or group of I/O cells over a period of time, including but not limited to, a clock frequency, a clock period, and a calibration session. One measure of "switching activity intensity" may be integrating the toggle rate over a period of time.

Figure 1:
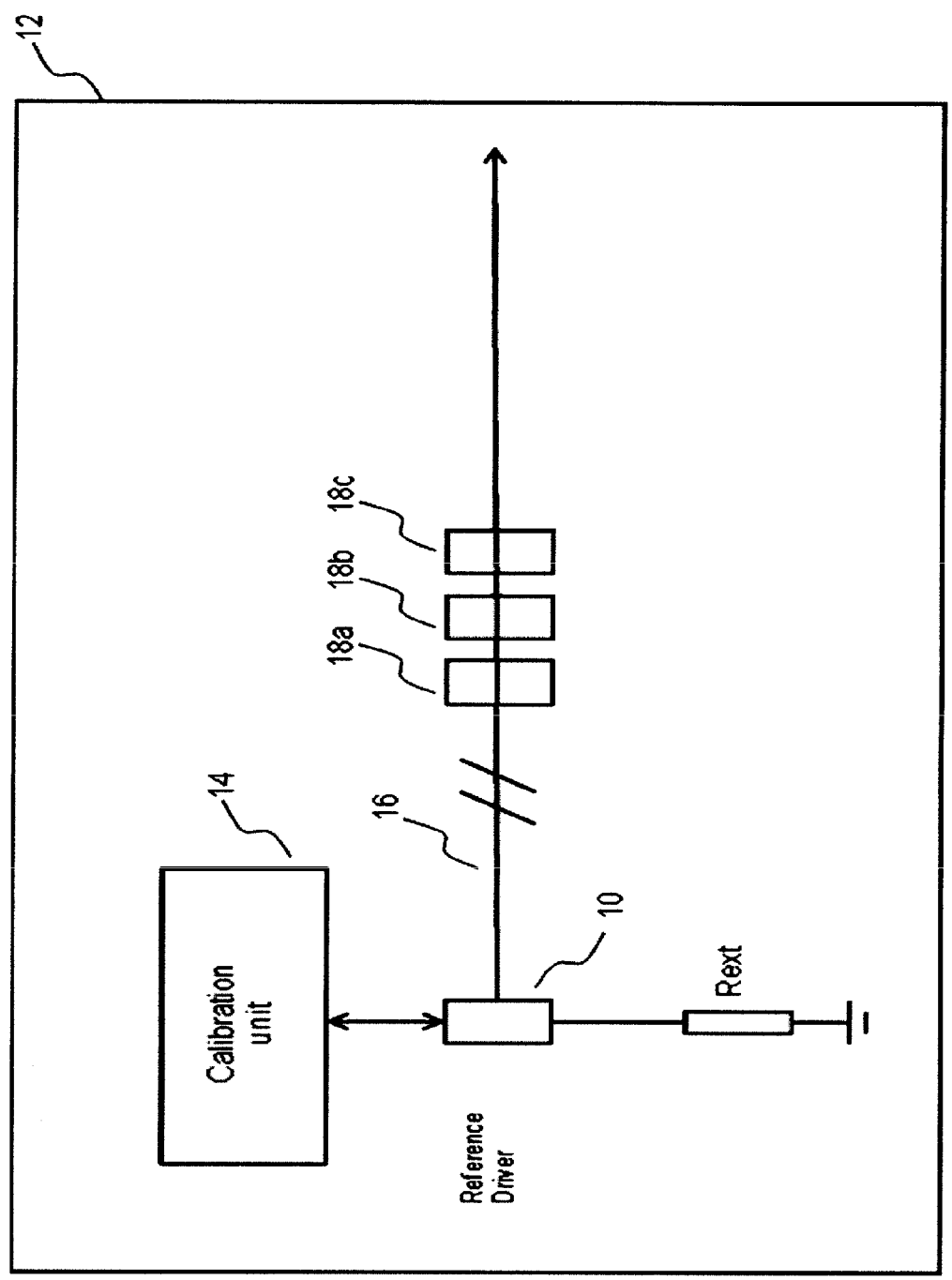
FIG. 1 schematically shows an example of a solution associated with the prior art.

It may be advantageous to maintain accurately calibrated driving impedances of an I/O cell over the lifetime of a chip within a system in order to maintain the accuracy in signal exchange. FIG. 1 schematically shows an example of a chip 12. For calibration purposes, chip 12 may be provided with pad (not shown) for connecting I/O calibration cell 10 externally to a resistor Rext. Rext may be a precision resistor. An external resistor may be used because the resistor is sufficiently divorced from an IC's presently-occurring operating conditions, and therefore remains stable enough to provide a reliable reference. Further, resistor parameter variation is small because of the materials used to manufacture reference resistors. An example of a calibration process shall be described below.

Calibration unit 14 may be arranged to adjust an operating parameter of, e.g., I/O calibration cell 10. The operating parameter may be measured in relation to resistor Rext, for example. A non-limiting and non-exhaustive list of operating parameters may include, for example, driving capability (e.g., pull-up impedance, pull-down impedance), internal impedance, drive strength (current), voltage threshold, and bias current. Based on an operating parameter reaching, e.g., a desired quantity in relation to, e.g., resistor Rext, a determined operating parameter (which may be the same or related to the measured operating parameter) may be transmitted to set an operating parameter. In the shown example, the determined operating parameter may be transmitted along, e.g., bus 16, to set an operating parameter of I/O cells 18a, 18b, and 18c, wherein I/O cells 18a-c may be in the same group of I/Os serving the same interface. I/O calibration cell 10 may be an exact replica of the I/O cell being configured, e.g., I/O cells 18a, 18b, and 18c.

Aspects of the invention are based on the insight that problems with the technique of FIG. 1 arise because of aging effects of active devices that compose an I/O cell may diverge, for example, by cell type (e.g., clock cell, data cell, control cell, strobe cell) and/or switching activity intensity over time for each of the cells.

To maintain accurate I/O operating parameters, divergent aging effects should be taken into account, in particular aging effects that cause slower switching speeds (e.g., propagation delay), which in turn may cause a relative delay shift of synchronous signals within an IC or a complete non-functionality of pipelined circuits due to hold time variations.

Figure 2:
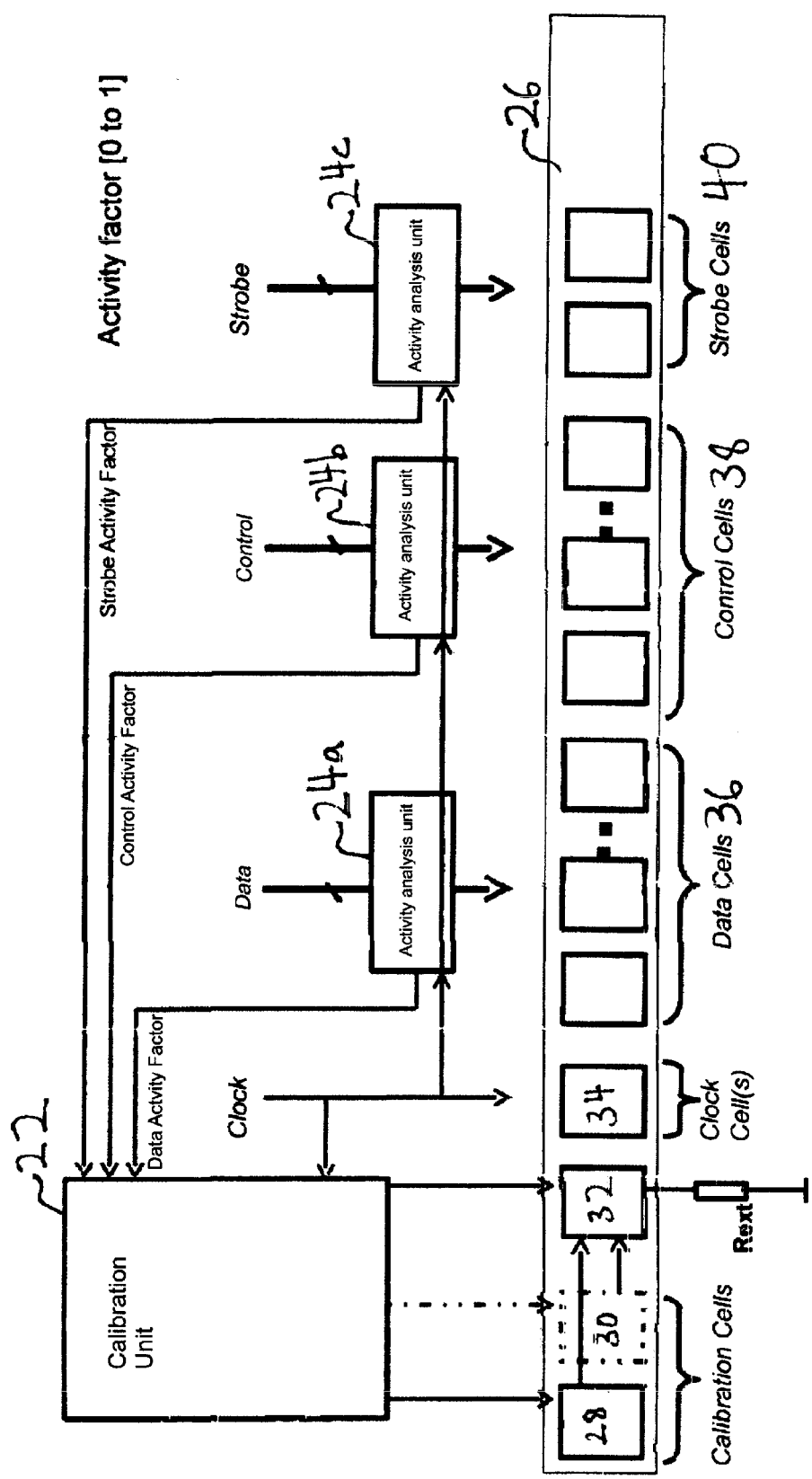
FIG. 2 schematically shows an example of an embodiment I/O circuit.

FIG. 2 schematically shows an example of an embodiment I/O circuit 20. I/O circuit 20 may include, for instance, a calibration unit 22, one or more activity analysis units, e.g. three activity analysis units 24a, 24b, and 24c, and an interface 26. Interface 26 may be an interface of a data transfer protocol on I/O circuit 20. Interface 26 may include at least I/O calibration cell 28, pad 32, clock cell 34, data cells 36, control cells 38, and strobe cells 40. In some embodiments, all cells, except calibration cells 28 and 30, may be directly coupled to a corresponding pad (not shown). In some embodiments, calibration cell 28 and optional calibration cell 30 may be coupled to pad 32, wherein the outputs of each calibration cell may be multiplexed to pad 32. In some embodiments, each calibration cell includes a pad.

Interface 26 may be arranged to transmit output signals, for example, clock signals, data signals, control signals, and strobe signals which compose a communication protocol, via the respective cells clock cell 34, data cells 36, control cells 38, and strobe cells 40. Each output signal may for example be a data transfer protocol output signal type.

The activity analysis unit may correspond with a cell type. For example, activity analysis unit 24a may analyze a data signal which may be fed in one or more data cells of, e.g., data cells 36. An activity analysis unit may further base its activity analysis on, e.g., a clock signal. The clock signal may notably be a gated clock signal or a clock signal that may alternate between gated and non-gated states. For example, if the activity factor represents how often the output changes of an IO cell with respect to the clock signal, then the activity factor may be related to an IO cell's toggling rate.

In some embodiments, a data path logic activity factor may be set based on an interface access duty cycle. To explain further, an activity factor of 0.5 may be selected because a data I/O cell may switch once from low to high state and once from high to low state per clock period. In some embodiments, a data path logic activity factor may be based or further based on burst access. For example, a duty cycle of a burst access to the interface may be 40%, corresponding to additional activity factor of 0.4. In some embodiments, a data path logic activity factor may be based or further based on statically-based switching activity. For example, statistically only half of the data bits/cells may be switching, while the other half may be stable, which may correspond to additional activity factor of 0.5. The aggregate activity factor may then be calculated by multiplying the separate activity factors (e.g., 0.5×0.4×0.5=0.1 or 10%). Activity factors for control signals may be calculated similarly and may be smaller than the data activity factors. However, the clock and strobe activity factors are close to 1 when the interface is operated, and therefore their activity factors may be set by the duty cycle of the burst accesses.

In this embodiment, activity analysis unit 24a provides an activity factor for emulating the aging effects due to switching based on the data signal and the clock signal. Emulation includes imitating the behavior or characteristic of an arbitrary I/O cell through I/O signal analysis, empirically-determined data, and/or statistical models of transistor behavior. For example, an activity factor may relate to a switching pattern that induces aging effects, wherein the extent of the induced aging effects may be determined by the activity factor.

An activity factor may range from 0 to 1, wherein 0 represents no or the lowest switching activity intensity and 1 represents the highest switching activity intensity. Various resolutions may be used and alternative embodiments include other scales besides 0 to 1.

An I/O cell's transistor switching activity may increase or decrease the output impedance of the I/O cell based on a dominant ageing mechanism, but switching activity intensity may vary among I/O cells of different cell types and even I/O cells of the same cell type. In some embodiments, the activity factor represents a statistical-modeled switching activity intensity for I/O cells of the same cell type or alternative grouping such as by channel, by a shared interface device (e.g., a memory), and sub-groups thereof (e.g., address I/O cells of a memory).

In some embodiments, all cells of an IC interface may form a single group, wherein the activity factor represents an overall switching activity.

Independent of I/O cell grouping, the activity factor may represent a total accumulated switching activity (i.e., absolute scale), but may also represent a switching activity intensity, i.e., a switching activity per, for example, number of clock cycles or other calibration session length. Such an activity factor may be accumulated with past activity factors to form a moving average switching intensity activity to, for example, ameliorate for unusual switching activity intensity during a particular calibration session.

In this embodiment, activity analysis unit 24a analysis the switching activity intensity of data cells 36 based on the data and clock signals. For each calibration session, an activity factor may be supplied, which will be used to emulate the switching activity intensity, as described below. A calibration session may be set based on a time length, a number of clock cycles, or on an amount of transmitted data. A calibration operation could be initiated based upon some process requests from other circuitry or it could be initiated and/or ended upon an external command by the user.

The length of a calibration session may be equal, for example, to a number of clock cycles or a period of time.

At the end of the calibration session, an activity factor may be transmitted to calibration unit 22. For example, activity analysis unit 24a determines an activity factor of one-third based on a gated clock signal and the data signal for a calibration session. Should the clock signal not be gated, the same data signal may result in an activity factor of one-half for a calibration session that otherwise includes an identical data signal.

With a gated clock signal and data signal may result in an I/O driving circuit of data cell 36 to switch from a logical 0 to 1 or 1 to 0 output per clock period. Based on this switching activity intensity (i.e., a toggling rate of 50%) for a calibration session, activity analysis unit 24a provides an activity factor of one-third. In alternative embodiments, the activity factor may represent a highest or lowest switching activity intensity of an I/O cell of a group of I/O cells based on an input signal and/or clock signal.

Activity analysis units 24b and 24c operate similarly. For example, activity analysis unit 24c determines an activity factor based on the strobe signal and clock signal. I/O circuits of strobe cells 40 typically switch in response to a state change (e.g., from logical 0 to 1) in the strobe signal. That is, there may be a one-to-one correspondence to the strobe signal and switching activity. Thus, should a data signal and strobe signal be identical to each other during a calibration session, activity analysis unit 24a may provide an activity factor of one-third, while activity analysis unit 24c may provide an activity factor of two-thirds.

Calibration unit 22 receives the various data activity factors and determines, for example, a data signal to apply to at least one I/O calibration cell. In some embodiments, calibration unit 22 receives an activity factor per cell grouping. In some embodiments, calibration unit 22 determines a single activity factor, which may be representative of the overall switching activity intensity of cells 34, 36, 38, and 40, i.e., a "global" activity factor. The calibration unit 22 may then output, for example, a switching signal based on a global activity factor or output a data signal based on one of the received activity factors (e.g., clock, data, control, and strobe activity factors).

As an illustrative example, calibration unit 22 may provide a switching signal to I/O calibration cell 28 based on the activity factors received from activity analysis units 24a, b, and c. Calibration unit 22 determines a switching signal to emulate the aging effects of, for example, a group of cells due to switching activity, within a single calibration cell.

The determined switching signal may be based on an average of the received activity factors. Although this may result in an I/O calibration cell impedance that may be both lower and higher than the actual impedance of some of the cells 34, 36, 38, and 40, such error is typically more accurate than no emulation at all.

For example, a DDR3 I/O cell built from Ivt transistors shows a 22% increase in impedance as a result switching at the maximum switching intensity, but an identically-built I/O calibration cell showed only approximately a 10% increase. However, by exposing the I/O calibration cell to a switching pattern signal, as described below, the I/O calibration cell's aging effects will increase and thus so will its intrinsic impedance.

In some embodiments, the determined switching signal may be applied only to I/O calibration cell 28. Thus, by receiving the determined switching signal, I/O calibration cell 28 receives a "designed" pattern that causes a similar level of aging impact that cells 34, 36, 38, and 40 undergo if a global activity factor is used. That is, the operation of I/O calibration cell 28 emulates the ageing affects of cells 34, 36, 38, and 40.

For example, based on an activity factor and clock signal, calibration unit 22 may create a switching signal, whose frequency may be equal to Clock Frequency×activity factor. To explain further, a counter-based cell with an activity factor of 0.2 may output for 2 clock cycle periods out of every 10 clock cycle periods, and may block (i.e., gate) for the 8 other clock cycle periods.

Thus, a switching signal may switch an I/O calibration cell twice per calibration session if the calibration session is equal to 10 clock cycle periods. The switching may be periodic or aperiodic. The only requirement may be that the switching signal produces a number of switches set by the activity factor within a time period, e.g., a calibration session. That is, the switching activity intensity is equal in both the calibration cell and the counter-based cell.

A switching signal pattern may correspond to an activity factor in a look-up table. The switching signal may be applied during a calibration session or some portion thereof. That is, the switching signal may induce aging effects at a faster rate than to the aging effect which corresponds to the activity factor of a calibration session, but is applied for a proportionally shorter time than a full calibration session.

If calibration unit 22 changes an operating parameter of I/O calibration cell 28 after a global switching pattern is applied, the operating parameter may be determined taking into account the aging effects of cells 34, 36, 38, and 40. As described in FIG. 1, an operating parameter of I/O calibration cell 28 may be measured or adjusted with respect to resistor Rext. The operating parameter or related operating parameter may be transmitted to one or more groups of cells 34, 36, 38, and 40 and the cells may be adjusted accordingly. Transmitted operating parameters include driving signal strength and may be represented by a multi-bit digital word. In some embodiments, the driving signal strength may be represented by an analog bias voltage.

As will be explained in more detail in respect to FIG. 3, more than one I/O calibration cell may be used. For example, I/O calibration cell 28 may receive a switching pattern corresponding to a high switching activity and I/O calibration cell 30 receives a switching pattern corresponding to a low switching activity. In some embodiments, an I/O calibration cell may be provided for each cell group type (e.g., data cells, control cells).

An I/O cell type may age at a different rate than other I/O cell types. That is, I/O pad types may have divergent aging effects. This may relate not only to an absolute number of switching, but also a switching activity intensity. For example, low-intensity I/O cells may be more susceptible to bias temperature instability and high-intensity I/O cells may be more susceptible to hot carrier injection. Thus, by providing an I/O calibration cell for each cell type or for each group of cells with a similar activity level, these effects may be more accurately emulated by their respective I/O calibration cell.

Figure 3:
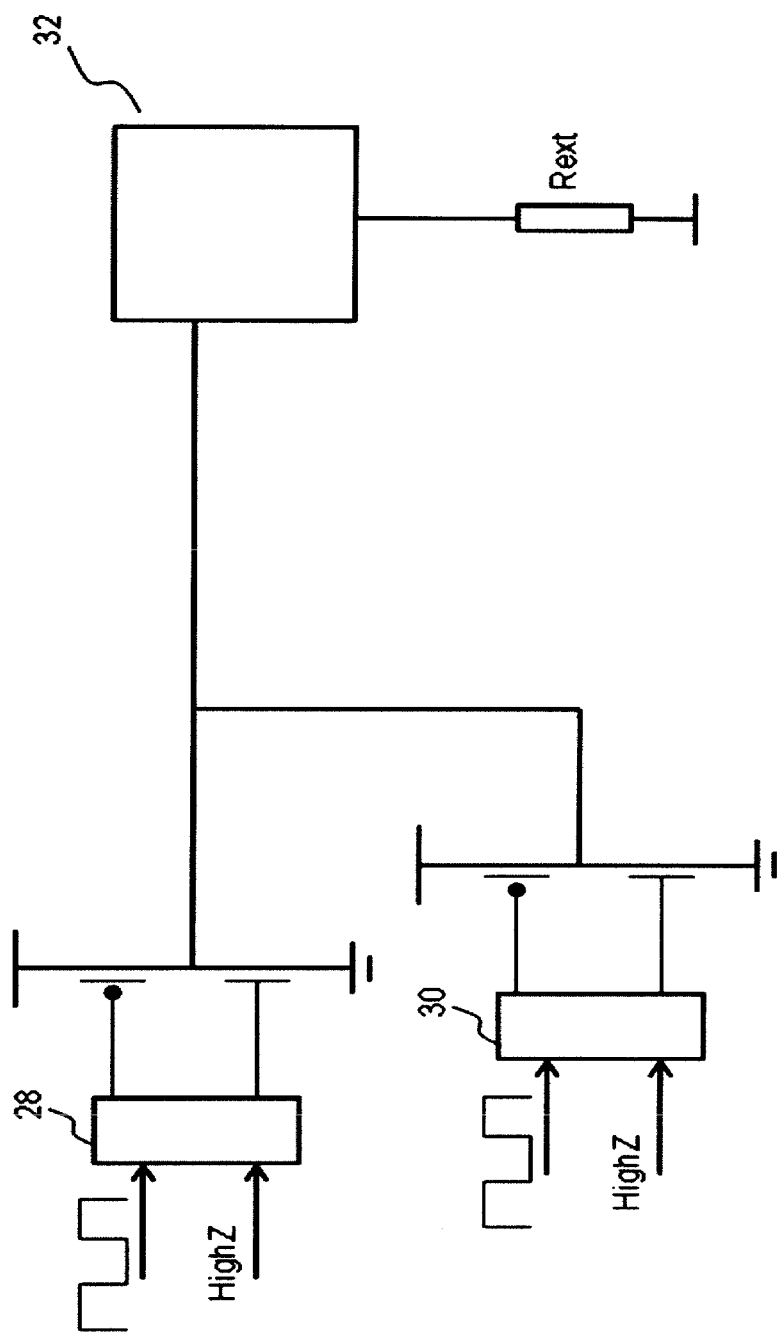
FIG. 3 schematically shows an example of embodiment I/O calibration cells.

For example, FIG. 3 schematically shows an example of embodiment I/O calibration cells 28 and 30. In some embodiments, a calibration unit (not shown) may generate a switching pattern signal based on each generated activity factor (shown as a square wave input), the generated activity factor including a high-activity factor and a low-activity factor. In some embodiments, calibration cell 28 may be the high-activity calibration cell and calibration cell 30 may be the low-activity calibration cell.

In some embodiments, the calibration unit may alternately drive, within a time period equal to the calibration session, one of two I/O calibration cells 28, 30 with the switching pattern signal based on the high-activity factor and the other with the low-activity factor, wherein each switching pattern signal emulates the ageing effect of an I/O cell or group of cells corresponding to the activity factor.

In some embodiments, the calibration unit may further alternately connect the at least two I/O calibration cells 28, 30 through the same pad to external reference resistor Rext by, for example, applying a signal to the HighZ input to tristate calibration cells 28 or 30, and thus provide multiplexing between those calibration cells with the same pad, wherein the calibration cells 28 and 30 may be connected to Rext via pad 32. Such an arrangement can minimize pin count and power consumption of embodiments. Alternative embodiments may include calibration cells with individual pads (i.e., each calibration cell includes a pad).

In some embodiments, calibration cells 28 and 30 may switch because of a switching signal in tandem or consecutively. For example, in some embodiments calibration cells 28 and 30 further include internal resistors (not shown), which may mimic a driving load.

Thus, the calibration unit may alternately measure an operating parameter of each the two calibration cells 28, 30 with respect to the reference resistor when a calibration cell is in communication with resistor Rex (e.g., non-tristated), and alternately drive each of the two calibration cells 28, 30 with the high- or low-activity switching pattern signal, all during a calibration session. Thus, the calibration cells 28 and 30 may be both "aged" and "measured" within a time period equal to a calibration session, wherein the process may repeat every calibration session.

In some embodiments, a calibration unit may take into account that although calibration cells 28 and 30 may be connected to load Rext, the actual I/O cells (e.g., data cells, control cells) may be connected to a different effective load. Thus, in some embodiments, the switching pattern signal takes termination load into account. Although FIG. 3 shows two calibration cells, embodiments include similar techniques applied to three or more calibration cells sharing an external resistor.

Figure 4A:
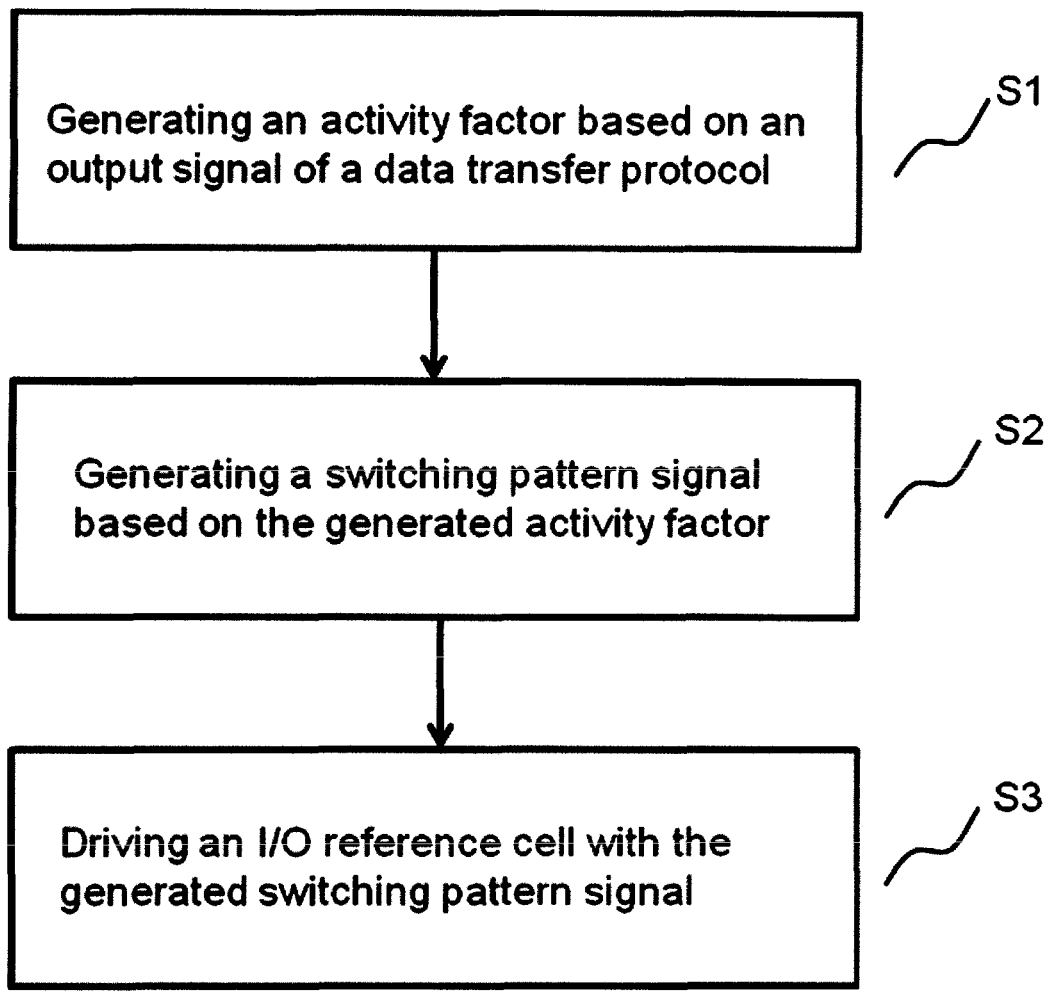
FIGS. 4a and 4b show flow charts of examples of embodiments of methods for emulating an aging effect.

FIG. 4a shows a flow chart of an example of an embodiment of a method for emulating an aging effect. Step S1 includes generating an activity factor based on an output signal of a data transfer protocol (e.g., a clock, data, control, or strobe signal). Step S2 includes generating a switching pattern signal based on the generated activity factor, and Step S3 includes driving an I/O calibration cell with the generated switching pattern signal, wherein the switching pattern signal emulates the ageing effect of the IO cell.

In some embodiments, step S1 includes generating an activity factor further based on a clock signal. In some embodiments, step S1 includes generating an activity factor, wherein each generated activity factor may be respectively based on at least the data signal, the control signal, and the strobe signal. In such embodiments, step S2 may include generating switching pattern signals, each generated switching pattern signal receptively based on each generated activity factor.

Figure 4B:
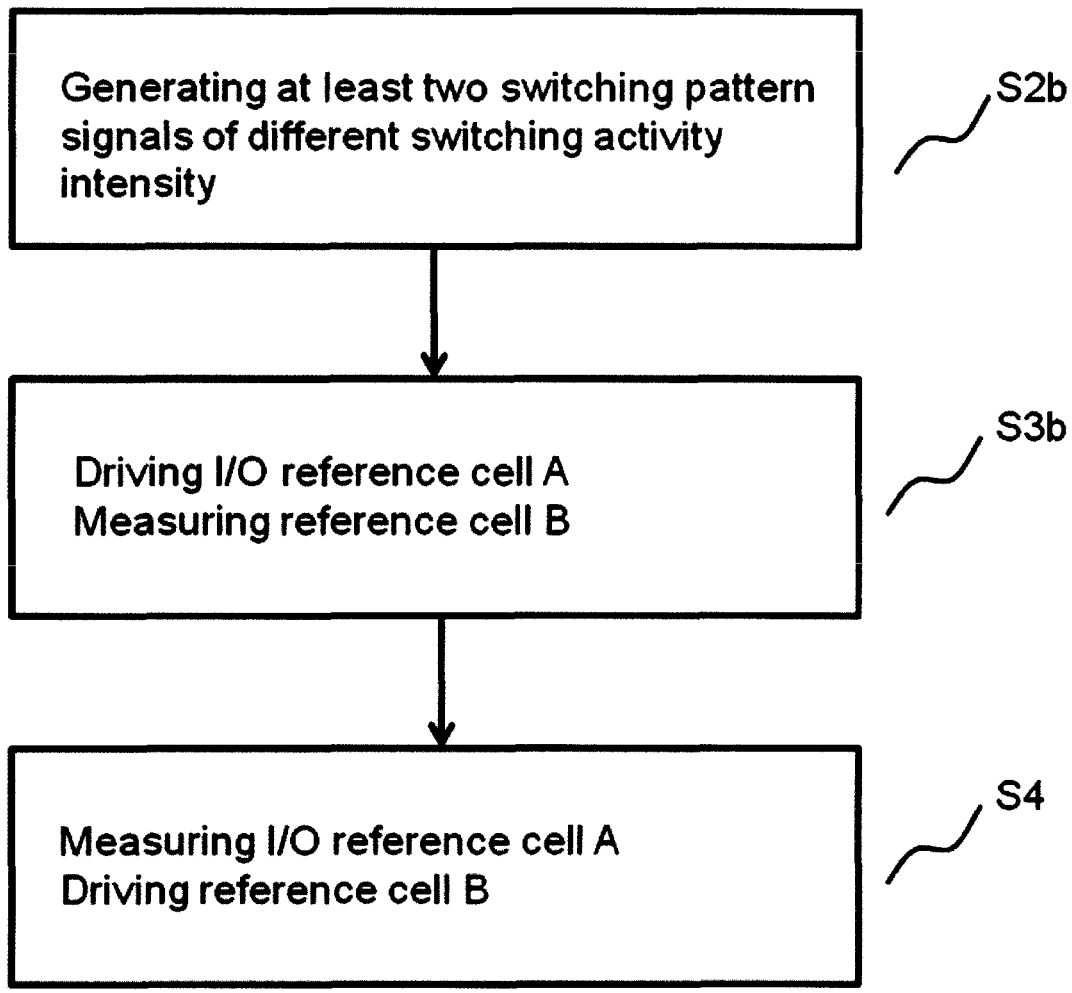

FIG. 4b shows a flow chart of an example of an embodiment of a method for emulating an aging effect. 16. Step 1 may be the same or similar as in FIG. 4a, and thus are not further discussed. Step S2b includes generating at least two switching pattern signals, wherein each generated signals has a different switching activity intensity. Steps S3b and 4 include alternately driving and measuring an operation parameter of at least two I/O calibration cells, each being driven by a respective switching activity signal.

In some embodiments, the at least two I/O calibration cells may be alternately driven and measured within a time period equal to the calibration session. In some embodiments, a first calibration cell may be driven with a first switching activity signal, then measured as a second calibration cell may be being driven with a second switching activity signal, and then measured, all of which occurs within a calibration session.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on transitory or non-transitory computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Thus reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, activity analysis units 24a, 24b, and 24c may be "housed" within calibration unit 22.

Thus, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit comprising:
   an input/output "I/O" cell arranged to drive an output signal;
   an activity analysis unit arranged to generate an activity factor based on the output signal, the activity factor representing a switching activity intensity of the I/O cell, the switching activity intensity associated with an ageing effect of the I/O cell;
   a calibration unit arranged to generate a switching pattern signal based on the generated activity factor; and
   an I/O calibration cell arranged to be driven by the switching pattern signal, wherein the switching pattern signal emulates the ageing effect of the I/O cell.

2. The integrated circuit of claim 1, wherein the activity analysis unit is arranged to generate the activity factor further based on a clock signal.

3. The integrated circuit of claim 1, further comprising a power supply common to the I/O cell and the I/O calibration cell.

4. The integrated circuit of claim 1, further comprising a plurality of I/O cells, wherein:
   each sub-plurality of the plurality of I/O cells forms a cell group type of a data transfer protocol, the cell group type including at least a data cell group, a control cell group, and a strobe cell group of the data transfer protocol, and
   the activity analysis unit is arranged to generate the activity factor based on a clock signal and output signals of the data transfer protocol, the activity factor representing a switching activity intensity of the plurality of I/O cells, the activity factor associated with an ageing effect on the plurality of I/O cells driving the output signals, the output signals including at least a data signal, a control signal, and a strobe signal of the data transfer protocol.

5. The integrated circuit of claim 4, further comprising an I/O calibration cell for the data cell group, an I/O calibration cell for the control cell group, and an I/O calibration cell for the strobe cell group, wherein:
the activity analysis unit is arranged to generate an activity factor for each cell group type,
the calibration unit is arranged to generate a switching pattern signal based on each generated activity factor, and
the I/O calibration cells are arranged to be driven by their respective switching pattern signal, wherein the respective switching pattern signal emulates the ageing effect of the I/O cells forming the cell group type.

6. The integrated circuit of claim 1, further comprising a plurality of I/O cells and at least two I/O calibration cells, wherein:
at least two sub-pluralities of the plurality of I/O cells demonstrate different switching activity intensities with respect to one another, including one of the sub-pluralities having a higher switching intensity than the other, each of the at least two sub-plurality I/O cells arranged to drive a respective output signal,
the activity analysis unit is arranged to generate an activity factor based on each of the respective output signals driven during a calibration session, and
the calibration unit is arranged to:
generate a switching pattern signal based on each generated activity factor, the generated activity factor including a high-activity factor and a low-activity factor, and
alternately drive, within a time period equal to the calibration session, one of the at least two I/O calibration cells with the switching pattern signal based on the high-activity factor and the other with the low-activity factor, wherein each switching pattern signal emulates the ageing effect of the respective sub-plurality I/O cell.

7. The integrated circuit of claim 6, further comprising an external reference resistor, wherein the calibration unit is further arranged to alternately connect the at least two I/O calibration cells to the external reference resistor.

8. The integrated circuit of claim 6, wherein the at least two I/O calibration cells further include internal resistors.

9. The integrated circuit of claim 8, wherein the calibration unit is further arranged to within the time period equal to the calibration session:
alternately measure an operating parameter of each the at least two I/O calibration cells with respect to the reference resistor, and
alternately drive each of the at least two I/O calibration cells with the high- or low-activity switching pattern signal.

10. The integrated circuit of claim 7, wherein the calibration unit is further arranged to within the time period equal to the calibration session:
alternately measure an operating parameter of each the at least two I/O calibration cells with respect to the reference resistor, and
alternately drive each of the at least two I/O calibration cells with the high- or low-activity of an I/O cell, the switching activity intensity associated with an ageing switching pattern signal.

11. The integrated circuit of claim 2, wherein the activity analysis unit is arranged to generate the activity factor based on a toggle rate of the I/O cell during a calibration session.

12. An input/output "I/O" calibration device, comprising:
an activity analysis unit arranged to generate an activity factor based on an output signal of a data transfer protocol, the activity factor representing a switching activity intensity effect of the I/O cell, and the output signal including least one of a data signal, a control signal, and a strobe signal of the data transfer protocol; and
a calibration unit arranged to generate a switching pattern signal based on the generated activity factor, wherein the switching pattern signal emulates the ageing effect of the I/O cell.

13. An aging effect emulation method, comprising:
generating an activity factor based on an output signal of a data transfer protocol, the activity factor representing a switching activity intensity of an I/O cell, the switching activity intensity associated with an ageing effect of the I/O cell, and the output signal including at least one of a data signal, a control signal, and a strobe signal of the data transfer protocol;
generating a switching pattern signal based on the generated activity factor; and
driving an I/O calibration cell with the generated switching pattern signal, wherein the switching pattern signal emulates the ageing effect of the I/O cell.

14. The method of claim 13, wherein generating the activity factor comprises generating the activity factor further based on a clock signal.

15. The method of claim 13, wherein the output signal includes at least the data signal, the control signal, and the strobe signal of the data transfer protocol.

16. The method of claim 15, wherein:
generating the activity factor comprises generating an activity factor each respectively based on at least the data signal, the control signal, and the strobe signal, and
generating the switching pattern comprises generating switching pattern signals, each generated switching pattern signal receptively based on each generated activity factor.

17. The method of claim 13, further comprising:
alternately measuring an operating parameter of each of at least two I/O calibration cells with respect to the reference resistor, wherein
generating the activity factor comprises generating the activity factor every calibration session,
driving the I/O calibration cell comprises alternately driving one of the at least two I/O calibration cells with a first output signal and driving the other of the at lest two I/O calibration cells with a second output signal, the first output signal inducing a higher switching activity in the one I/O calibration cell than the second output signal induces in the second output signal, and each of the at least two I/O calibration cells are alternately driven and measured within a time period equal to the calibration session.

* * * * *